United States Patent [19]
Sowards

[11] Patent Number: 5,148,395
[45] Date of Patent: Sep. 15, 1992

[54] DUAL EEPROM CELL WITH CURRENT MIRROR DIFFERENTIAL READ

[75] Inventor: David K. Sowards, Santa Clara, Calif.

[73] Assignee: Exar Corporation, San Jose, Calif.

[21] Appl. No.: 343,974

[22] Filed: Apr. 26, 1989

[51] Int. Cl.$^5$ .............................................. G11C 16/04
[52] U.S. Cl. .................................. 365/185; 365/207; 365/208; 365/210; 365/189.09
[58] Field of Search ........... 365/104, 182, 184, 189.09, 365/185, 207, 208, 210, 154; 340/173; 307/262, 270

[56] References Cited

U.S. PATENT DOCUMENTS

| | | | |
|---|---|---|---|
| 4,271,487 | 6/1981 | Craycraft et al. | 365/154 |
| 4,371,956 | 2/1983 | Maeda et al. | 365/185 |
| 4,725,984 | 2/1988 | Ip et al. | 365/185 |
| 4,727,519 | 2/1988 | Morton et al. | 365/208 |
| 4,791,324 | 12/1988 | Hodapp | 365/207 |
| 4,884,241 | 11/1989 | Tanaka et al. | 365/210 |
| 4,933,906 | 6/1990 | Terada et al. | 365/208 |
| 4,980,859 | 12/1990 | Guterman et al. | 365/154 |

FOREIGN PATENT DOCUMENTS 0224125 3/1987 European Pat. Off. .

OTHER PUBLICATIONS

"A 1Mb Flash EEPROM", Cernea et al., IEEE International Solid-State Circuits Conference, Feb. 1989.
Patent Abstracts of Japan, vol. 10, No. 243 (P-489) Aug. 21, 1986 and JP-A-61 073 300 (Toshiba).
Electronics, Mar. 17, 1986, "Found: The Final Link to the One-Chip System", pp. 30-34, Sierra Semiconductor Corporation.

Primary Examiner—Joseph L. Dixon
Assistant Examiner—Jack A. Lane
Attorney, Agent, or Firm—Townsend and Townsend

[57] ABSTRACT

An EEPROM device having dual EEPROM transistor blocks for storing a charge and a current mirror for determining the difference in charge between the EEPROM transistor blocks. During a write operation, one EEPROM transistor block is charged while the other block is discharged. During a read operation, the current mirror attempts to supply equal current to each of the EEPROM transistor blocks. However, because each block has a different charge, more current will be forced through one leg of the current mirror. This results in a voltage difference across the legs of the current mirror which can be read by a voltage sensor.

2 Claims, 3 Drawing Sheets

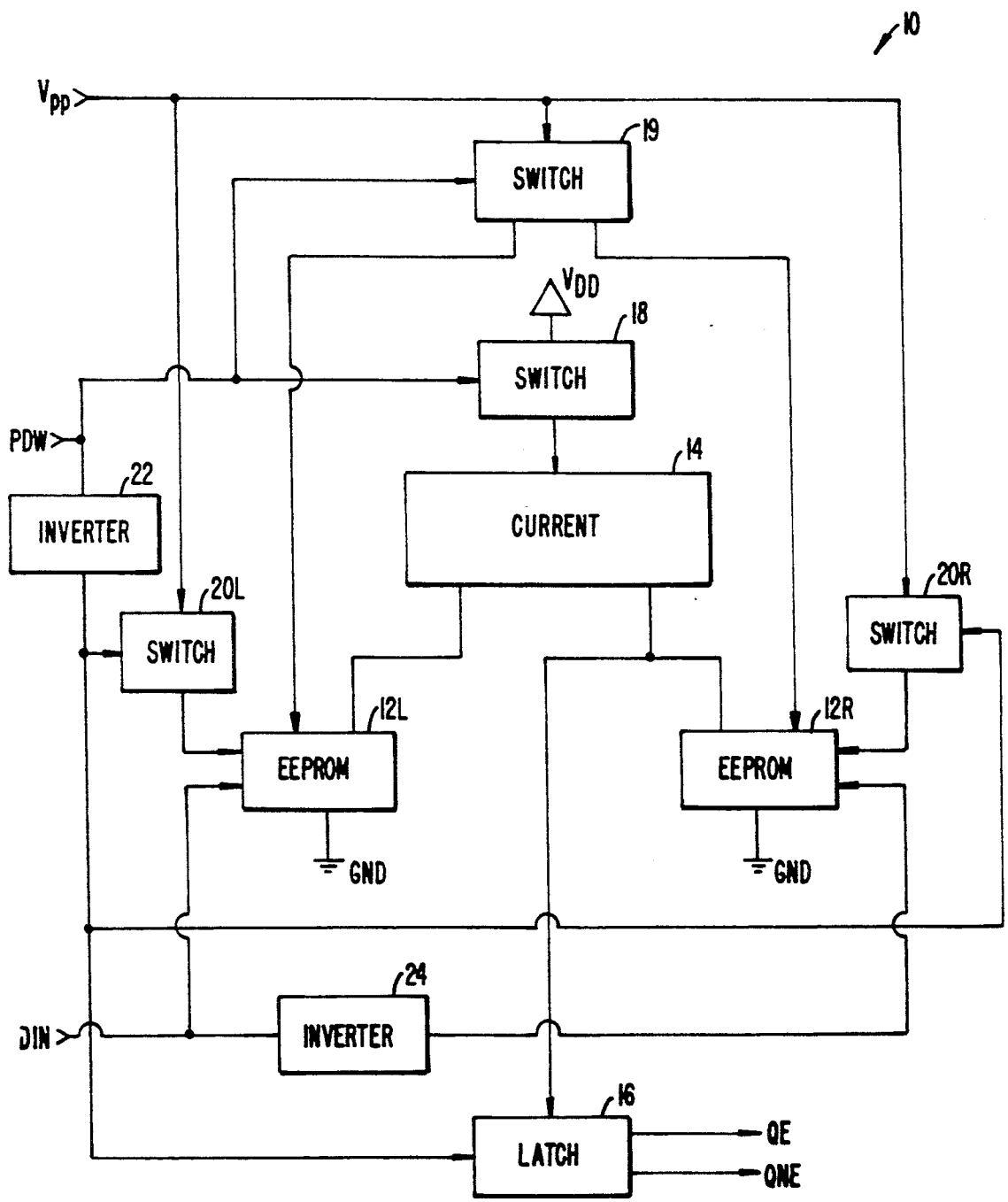
FIG._1.

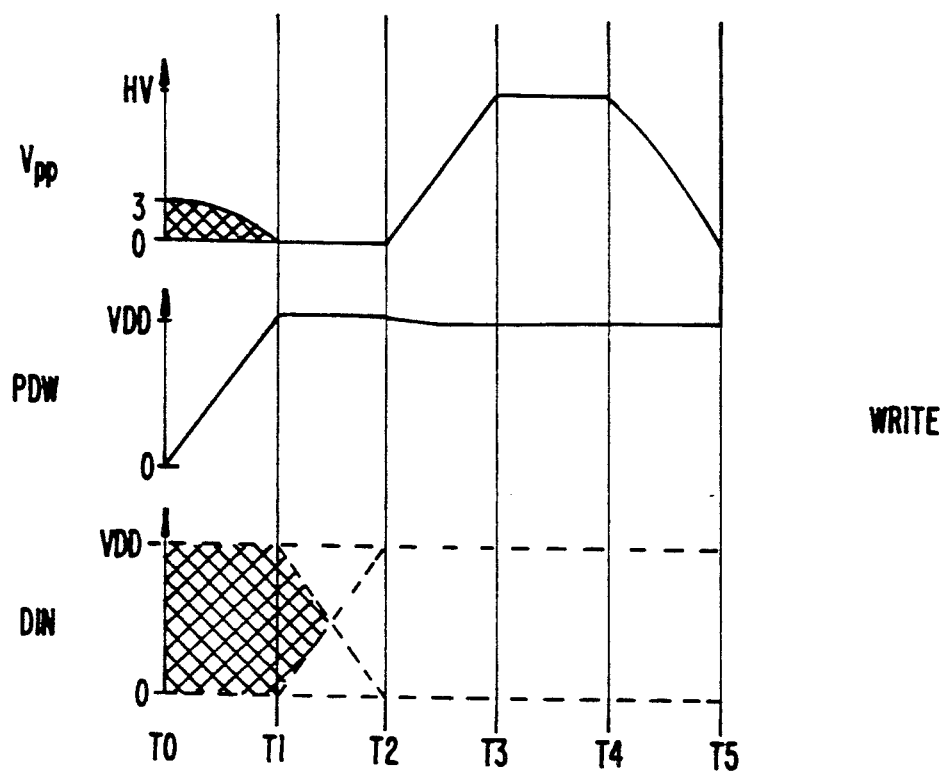
FIG._2a.
WRITE
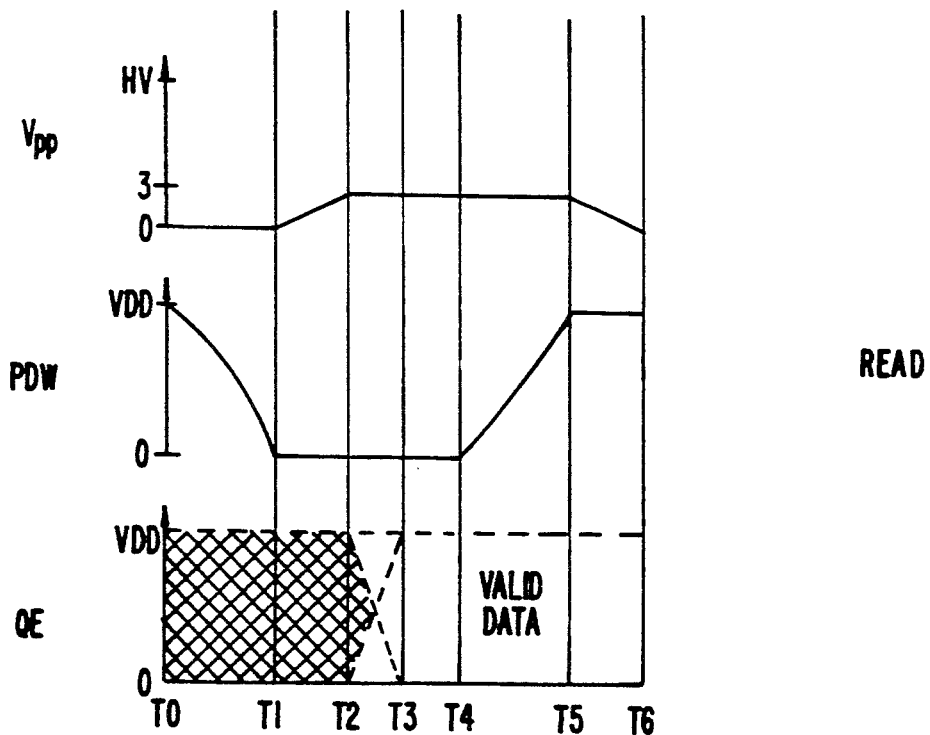
FIG._2b.
READ

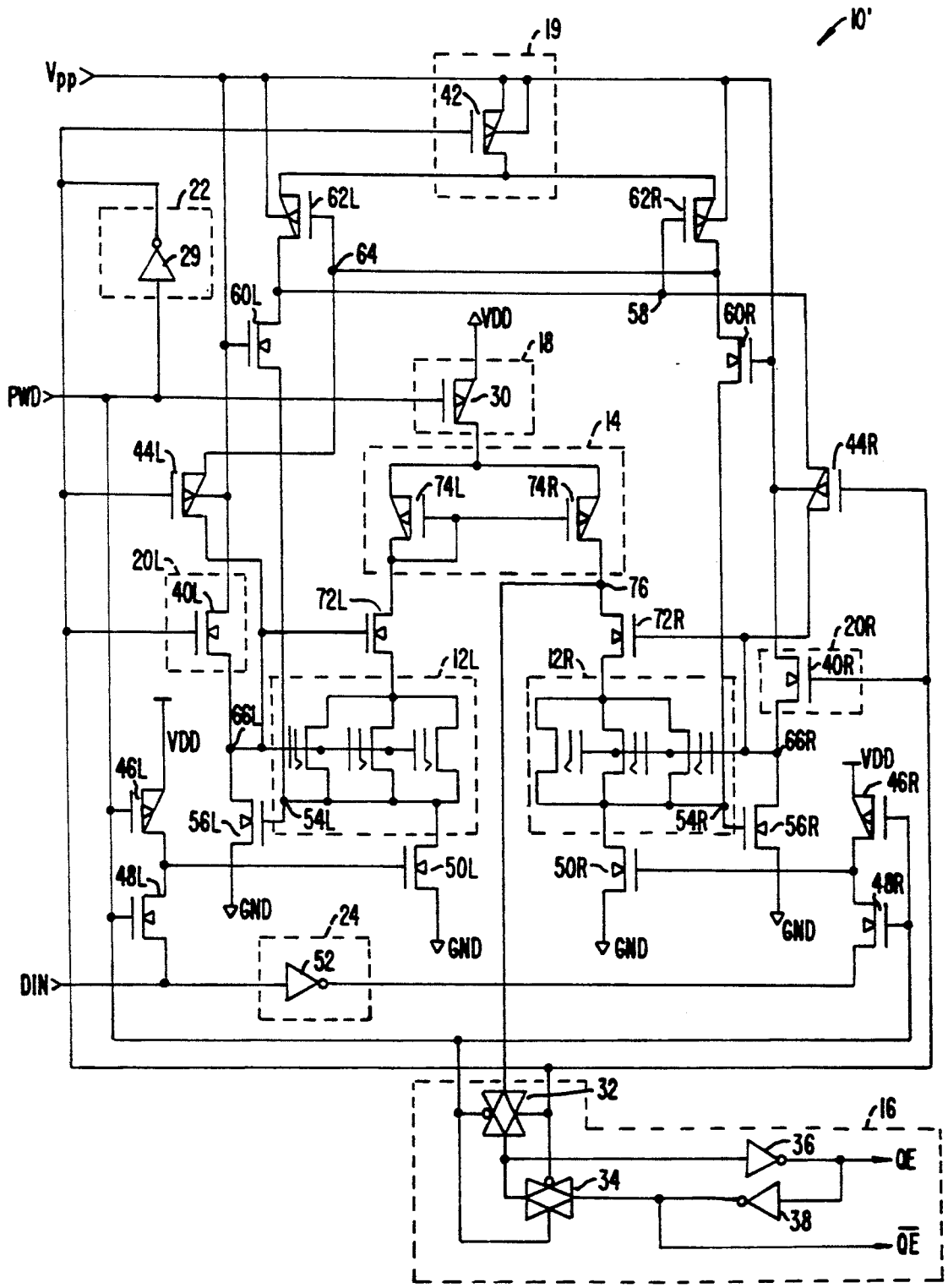
FIG._3.

DUAL EEPROM CELL WITH CURRENT MIRROR DIFFERENTIAL READ

FIELD OF THE INVENTION

The present invention relates to EEPROM devices, and more particularly, to a dual transistor EEPROM cell using differential detection with a current mirror.

BACKGROUND OF THE INVENTION

Conventional EEPROM cells have a single EEPROM transistor that represents a single bit of data by storing a voltage charge. The transistor is charged or discharged during a programming (write) operation. The transistor is then read during a read operation by coupling the source or drain of the EEPROM transistor to a sense amplifier which compares the charge on the EEPROM transistor to a reference voltage.

Sierra Semiconductor Corporation discloses an EEPROM cell (*Electronics*, Mar. 17, 1986, pp. 30–34) that utilizes a CMOS latch (flip-flop) with dual EEPROM transistor switches. The dual EEPROM transistor switches represent a bit by one EEPROM transistor being charged and the other not or vice versa. A differential latch detects the difference in charge between the EEPROM transistor switches, thereby determining the value stored in the EEPROM cell.

Because a high voltage on the drain will cause data errors, the supply voltage for the Sierra EEPROM cell must be within a 0 volt to approximately 6 volt range. Furthermore, Vcc must be pulsed during read because of the differential latch. Therefore, the access time needed to read the EEPROM cell is increased by the pulse time. In addition, parasitic capacitance and unequal noise coupling can cause an inaccurate read at the EEPROM cell due to transients caused by the pulse. Furthermore, the read and write circuits for the EEPROM device are separated for control over and protection of the EEPROM cells.

SUMMARY OF THE INVENTION

The present invention is an EEPROM memory cell having dual EEPROM transistor blocks for storing a charge and a current mirror for determining the difference in charge between the blocks. During a write operation, the transistors in one EEPROM transistor block are charged while the transistors in the other transistor block are discharged. During a read operation, the current mirror attempts to supply equal current to each of the EEPROM transistor blocks. However, because each block has a different charge, more current will be forced through one leg of the current mirror. This results in a voltage difference across the legs of the current mirror which can be read by a voltage sensor.

The present invention also has an optional latch connected to the current mirror for latching the bit value represented by the EEPROM cell. Due to the latch, the current mirror does not need to be continuously on for every read of the EEPROM cell, thereby reducing the power consumed and heat generated by the cell.

The present invention also utilizes common pins for both read and write operations. A power down/write ("PDW") is used to simultaneously enable or disable the current mirror, connect the voltage programming signal ("VPP") as a write enable signal during a write operation, connect VPP as a voltage reference source during a read operation, and turn off or on the latch at the desired times. As a result, the amount of required interconnection wiring for operating the EEPROM cell is minimized, thereby decreasing the overall size and energy requirements of the circuit using the EEPROM cells.

The present invention uses a current driven sensor (the current mirror) as opposed to a voltage driven sensor to detect the voltage difference between the EEPROM transistor blocks. The current mirror is able to work in a "dirtier" environment (i.e. in a larger range of input and supply voltages) and it requires less space.

For a further understanding of the nature and advantages of the invention, reference should be had to the ensuing detail description taken in conjunction with the accompanying drawings.

BRIEF DESCRIPTION OF THE DRAWINGS

FIG. 1 is a block diagram of a preferred embodiment of the invention;

FIGS. 2a and 2b are timing diagrams of a write operation and a read operation for the preferred embodiment of the invention; and FIG. 3 is a circuit diagram of the preferred embodiment of the invention.

DETAILED DESCRIPTION OF THE PREFERRED EMBODIMENT

FIG. 1 is a block diagram of a preferred embodiment of the invention. An EEPROM cell 10 is shown utilizing two EEPROM transistor blocks 12L and 12R. Because there are two identical EEPROM transistor blocks, much of the surrounding circuitry is symmetrical. In order to show this symmetry, blocks transistors, or other devices that are symmetrical with other blocks, transistors or devices are labeled as L or R (left or right).

Both EEPROM transistor blocks are electrically coupled to the legs of a current mirror 14. An optional latch 16 is shown also connected to one of the legs of the current mirror. Also shown are four switches 18, 19, 20L and 20R and two inverters 22 and 24. The device has a voltage source ("VDD") and a ground ("GND"). There are three inputs; a voltage programming signal ("VPP"), a power down/write ("PDW") enable signal, and a data in signal ("DIN"). VPP, PDW and DIN are user dr microprocessor controlled. They are typically controlled by the internal circuitry of a fully integrated system such as systems developed for an individual customer or an application specific system. There are two outputs, QE and QNE, which are the inverse of each other. That is, when one is low, the other is high. The timing diagrams for the inputs to the EEPROM device are shown in FIGS. 2a and 2b.

FIG. 2a is a timing diagram showing the input voltage levels needed in order to write a bit of information onto the cell. The inputs are first shown at time T0 with VPP at approximately 0–3 volts), PDW at GND, (i.e. 0 volts) and DIN being at any desired level. This assumes that the latch is "open" and can read the present data bit and that the EEPROM cell has a random bit of information previously stored.

From time T0 to T1, the PDW signal is driven from GND to VDD in order to turn off the current mirror, turn on the EEPROM transistor blocks for data input, and latch the present data stored in the EEPROM cell. In addition, VPP is driven to GND. In FIG. 1, the PDW signal is inverted by inverter 22, turns off switches 20L and 20R, and turns on switch 19 thereby sending the VPP signal to the EEPROM transistor blocks. Furthermore, the high PDW signal turns off switch 18. This cuts the power to the current mirror, turning it off. Furthermore, the PDW signal is sent to the latch, causing it to latch the current data value.

From time T1 to time T2, the DIN signal is set to the desired bit of information. If a zero is desired to be stored in the EEPROM cell, then DIN is set to GND. If a 1 is desired to be stored in the EEPROM cell, then DIN is set to VDD. As shown in FIG. 1, the DIN signal is sent to the left EEPROM transistor block and is inverted by inverter 24 before being sent to the right EEPROM transistor block.

Once the DIN signal has stabilized, then the VPP signal is pulsed in order to write the information on DIN into the EEPROM cells. This is shown in FIG. 2a as being a voltage ramp upward from time T2 to time T3, as a stabilization period from time T3 to time T4, and as a voltage ramp downward from time T4 to time T5. As shown in FIG. 1, the VPP signal passes through switch 19 to the EEPROM transistor blocks (due to the high PDW signal). One transistor block is held high by the DIN signal and will be charged by VPP, and the other transistor block is held low by the DIN signal and will be discharged by GND.

FIG. 2b is a timing diagram showing the input voltage levels needed in order to read the bit of information stored in the EEPROM device and then latch this bit. The inputs are first shown at time T0 with VPP at ground and PDW at Vdd. This assumes that the latch is presently enabled. The value of DIN does not affect the read operation.

From time T0 to time T1, the PDW signal is ramped downward from VDD to GND in order to turn on the current mirror, turn off the EEPROM transistor blocks for storing data, and close the latch. Referring to FIG. 1, the PDW signal is inverted by inverter 22, thereby turning on switches 20L and 20R and turning off the VPP signal to the transistor blocks. The PDW signal is ramped downward which turns switch 19 off and causes switch 18 to turn on, thereby allowing the VDD voltage to turn on the current mirror. Furthermore, the PDW signal is sent to the latch which opens it and thereby allows the latch to read the data until PDW goes high again.

From time T1 to time T2, the VPP signal is ramped upward to a voltage level between two and four volts above GND. A preferred level of three volts is shown in the timing diagram. This intermediate voltage level drives the gates of both of the EEPROM transistor blocks, thereby turning them on. From time T2 to time T3, the current mirror attempts to pass the same amount of current to each of the EEPROM transistor block. However, because one transistor block is charged and the other is not, the current mirror is unable to do so. This results in a voltage potential between the EEPROM transistor blocks which is detected by the latch. After the data becomes valid after T3, the PDW signal can remain low. However, from time T4 to time T5, the PDW signal can be ramped upward, thereby latching the EEPROM cell data into the latch and allowing the EEPROM cell to enter a zero power state. VPP may then be ramped downward from time T4 to time T5, if desired, in preparation for a future write operation.

If the EEPROM device did not use a latch as shown in FIG. 1, then the input voltage levels shown from time T4 to time T6 of FIG. 2b would cause QE and QNE to become unknown.

FIG. 3 is a circuit diagram of a preferred embodiment of the invention. As shown in FIG. 1, the preferred embodiment of the invention includes left and a right EEPROM cells 12L and 12R coupled to the legs of current mirror 14 and switches 18, 19, 20L and 20R, inverters 22 and 24, and optional latch 16. Also shown, as in FIG. 1, are power sources VDD and GND, inputs VPP, PDW and DIN and outputs QE and $\overline{QE}$.

Three transistors are shown per left and right transistor block so that extended durability can be achieved. That is, if one out of the three transistors floating gates fails (i.e. it will leak charge when trying to store it or it is unable to remove charge once it has been trapped), then the other cells will still allow the device to function properly.

The circuit will now be described in use while referring to the timing diagrams shown in 2a and 2b. During the write operation PDW is ramped upward from GND to Vdd during time T0 to time T1. The PDW signal is also inverted by inverter 29. The PDW signal turns off P-channel transistor 30, thereby turning off the current mirror. Latch 16 is closed by the PDW signal turning off pass transistors 32 and turning on pass transistors 34. Inverters 36 and 38 keep outputs by latching it in a cross coupled configuration. The inverted PDW signal turns off N-channel bias transistors 40L and 40R and turns on P-channel transistor 42 thereby allowing a programming voltage VPP to be passed into the cell. In addition, the inverted PDW signal turns on P-channel transistors 44L and 44R thereby allowing the VPP signal to be transferred to the transistor gates of the correct EEPROM transistor block. Transistors 60L and 60R allow the transfer of the DIN signal to the left or right EEPROM transistor blocks depending upon whether a "0" or "1" is to be written. Furthermore, the PDW signal turns off P-channel transistors 46L and 46R and turns on N-channel transistors 48L and 48R, thereby allowing the DIN signal to be passed to N-channel transistor 50L and for DIN's complement (as inverted by inverter 52) to be passed to N-channel transistor 50R.

From time T1 to time T2, the DIN input signal must be driven to the data level desired. A DIN level of VDD represents a "1" to be written to the EEPROM device and a GND level represents a "0". The DIN input signal is then transferred to transistor 50L and the inverse is transferred to transistor 50R via inverter 52.

From time T2 to time T3, VPP is ramped upward to a High Voltage ("HV") level at approximately 22 volts. If a "1" is present on DIN, transistor 50L will keep voltage node 54L low thereby keeping N-channel transistor 56L off. This drives voltage node 58 low through N-channel transistor 60L even if there is current through transistor 62L. Then P-transistor 62R will always be on and will charge both voltage nodes 64 and 54R through N-channel transistor 60R. The high voltage on voltage node 64 will shut transistor 62L off and a latching effect will occur. Simultaneously, voltage node 66L will be charged through transistor 44L because transistor 56L is kept off and voltage node 66R is held low by transistor 56R. Thus, a high voltage is applied to the gates of EEPROM transistor block 12L, voltage node 66L and a low voltage on the EEPROM transistor blocks source at node 54L. This causes negatively charged electrons to be trapped on the floating gates of the EEPROM transistors of EEPROM transistor block 12L. While a low voltage is applied to the transistor gates of the right EEPROM transistor block a high voltage is applied to the transistor sources of the same EEPROM transistor block. This removes electrons from the floating gates of its EEPROM transistors until positively charged ions may be trapped on the EEPROM transistor floating gates. This difference of trapped charged will be sensed as will be described below.

If a "0" were present on the DIN input, then the circuitry described above would drive the opposite voltage levels to the left and right EEPROM cells. This would result in the left EEPROM cell having a positive charge on its EEPROM transistor and the right EEPROM cell having a negative charge on its EEPROM transistor. Again, this difference in stored charge will be sensed as a zero by the read circuitry.

From time T4 to time T5, the VPP voltage must be reduced while PDW is high and DIN is still stable in order to preserve the desired charge on the EEPROM transistors.

The EEPROM device can be read as shown in FIG. 2b. From time T0 to time T1, the PDW input is ramped downward to GND which turns transistors 42, 44L, 44R, 48L and 48R off and turns transistors 30, 40L, 40R, 46L and 46R on. This turns on the current mirror and prevents any changes to the contents of the EEPROM cells. The PDW input also opens the latch by turning on pass transistors 32 and turning off pass transistors 34.

From time T1 to time T2, the VPP voltage is ramped upwards to approximately two to four volts above GND. This drives the gates of the left and right EEPROM to the same reference level through transistors 40L and 40R. Transistors 72L and 72R limit the drain voltage on the left and right EEPROM cells. Because of the difference in the trapped charge and the EEPROM cells, the current mirror will be unable to drive equal currents through each of the EEPROM cells, thereby driving different current levels through transistors 72L and 72R. If the EEPROM transistor of EEPROM cell 12L was previously negatively charged, very little current will be driven into transistor 74L, which acts as a current mirror with transistor 74R. Therefore, a low gate to source voltage will appear on transistor 74R and will drive a relatively small current, with respect to 72R, to voltage node 76. Because the right EEPROM cell has a trapped positive or neutral charge on its gate, it will pull node 76 low through transistor 72R. This low voltage will be passed through pass transistors 32 and inverted into a one by inverter 36. Inverter 38 will drive $\overline{QE}$ low (which is equal to a "0" so that QE is equal to "1". If the opposite value were stored on the EEPROM device, current through transistor 74L would force transistor 74R to pull node 76 high and a "0" would be output on QE while a "1" would be output on $\overline{QE}$.

From time T4 to time T5, the PDW input signal may be ramped to VDD, thereby latching the value represented on the EEPROM device.

If one of the left transistor block transistors were to loose its negative charge it would supply a current to transistor 74L. There are three transistors on the right which have been caused to have a neutral or a positive charge. Therefore, they supply three times the current of the left transistor. Of course the right current will then drive node 76 low in spite of the malfunctioning transistor. In fact, this process is still true when two of six transistors fail and some cases when three or four of the six transistors fail.

While the above provides a full and complete disclosure of the preferred embodiments of the invention, various modifications, alternate constructions, and equivalents may be employed. For example, instead of combining the input signals (multiplexing), more input leads could be used. This would require fewer transistors because there is no multiplexing. Another example is using the cell without a latch as mentioned above. A further example is including multiple groups of EEPROM transistor blocks together so that circuitry may be shared. Accordingly, the above description and illustration should not be construed as limiting the scope of the invention, which is defined by the appended claims.

What is claimed is:

1. An EEPROM memory device comprising:
   a. a first EEPROM transistor block having at least one EEPROM transistor, said at least one transistor having a source, drain, and gate;
   b. a second EEPROM transistor block having at least one EEPROM transistor, said at least one transistor having a source, drain, and gate;
   c. a current mirror having a first leg coupled to the source of said at least one EEPROM transistor in the first EEPROM transistor block and a second leg coupled to the source of the EEPROM transistor in the second EEPROM transistor block;
   d. means, coupled to at least one of the legs of the current mirror, for detecting a voltage difference between the EEPROM transistor blocks;
   e. first switching means, coupled to the gate of each of the EEPROM transistors, for charging one of the EEPROM transistor blocks;
   f. second switching means, coupled to the drain of each of the EEPROM transistors, for discharging the other EEPROM transistor block not charged by said first switching means;
   g. means for disabling the current mirror; and
   h. first input means, coupled to the means for disabling the current mirror, for indicating when the current mirror should be disabled, wherein said first input means is also coupled to the first switching means for indicating when the first switching means should be activated to allow charging of a selected EEPROM transistor block.

2. The EEPROM memory device of claim 1 further comprising second input means, coupled to the second switching means, for indicating the EEPROM transistor block to be discharged.

* * * * *